US009923555B2

(12) United States Patent
Wang et al.

(10) Patent No.: US 9,923,555 B2
(45) Date of Patent: Mar. 20, 2018

(54) FINE-GRAINED POWER GATING IN FPGA INTERCONNECTS

(71) Applicant: The Regents of the University of California, Oakland, CA (US)

(72) Inventors: Chengcheng Wang, San Jose, CA (US); Dejan Markovic, Palo Alto, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/777,473

(22) PCT Filed: Mar. 14, 2014

(86) PCT No.: PCT/US2014/029404
§ 371 (c)(1),
(2) Date: Sep. 15, 2015

(87) PCT Pub. No.: WO2014/144830
PCT Pub. Date: Sep. 18, 2014

(65) Prior Publication Data
US 2016/0036428 A1  Feb. 4, 2016

Related U.S. Application Data

(60) Provisional application No. 61/791,243, filed on Mar. 15, 2013.

(51) Int. Cl.
*H03K 17/00* (2006.01)
*H03K 19/177* (2006.01)
(Continued)

(52) U.S. Cl.
CPC ....... *H03K 17/005* (2013.01); *H03K 19/0016* (2013.01); *H03K 19/018528* (2013.01);
(Continued)

(58) Field of Classification Search
CPC .................. H03K 17/005; H03K 19/17772
See application file for complete search history.

(56) References Cited

U.S. PATENT DOCUMENTS

| 5,682,110 A | 10/1997 | Rountree |
| 6,034,563 A * | 3/2000 | Mashiko ............ H01L 27/0218 327/377 |

(Continued)

FOREIGN PATENT DOCUMENTS

| CN | 1155187 A | 7/1997 |
| CN | 1615587 A | 5/2005 |

(Continued)

OTHER PUBLICATIONS

International Preliminary Report on Patentability for International Application PCT/US2014/029404, Report Issued Sep. 15, 2015, dated Sep. 24, 2015, 8 Pgs.

(Continued)

*Primary Examiner* — Lincoln Donovan
*Assistant Examiner* — Colleen O Toole
(74) *Attorney, Agent, or Firm* — KPPB LLP

(57) ABSTRACT

Systems and methods for power gating in logic and/or computing circuitry in accordance with embodiments of the inventions are disclosed. In one embodiment, a multiplexer for fine-grain power gating includes a first supply voltage and a second supply voltage, a plurality of inputs, a plurality of selection inputs, a selection circuitry configured to select one of the plurality of inputs, where one of the plurality of inputs is the first supply voltage and one of the selection inputs is a power gating enable input, an output inverter stage including a PMOS transistor and an NMOS transistor, where at least one input to the inverter stage is provided to the gates of the PMOS and NMOS transistors and selection of the power gating enable signal applies the first supply (Continued)

voltage to the gate of the PMOS transistor and places the PMOS transistor in a cutoff mode of operation.

10 Claims, 17 Drawing Sheets

(51) Int. Cl.
*H03K 19/0185* (2006.01)
*H03K 19/00* (2006.01)
*H03K 19/173* (2006.01)
*H03K 19/094* (2006.01)

(52) U.S. Cl.
CPC ... *H03K 19/09429* (2013.01); *H03K 19/1737* (2013.01); *H03K 19/17772* (2013.01)

(56) References Cited

U.S. PATENT DOCUMENTS

| | | | |
|---|---|---|---|
| 7,102,254 B2 * | 9/2006 | Veendrick | H03K 19/0016 307/126 |
| 7,355,440 B1 | 4/2008 | Santurkar et al. | |
| 8,004,310 B1 * | 8/2011 | Tiwari | H03K 19/0016 326/81 |
| 2005/0052936 A1 | 3/2005 | Hardee | |
| 2006/0022742 A1 | 2/2006 | Parris et al. | |
| 2007/0075743 A1 | 4/2007 | Oh | |
| 2011/0102014 A1 * | 5/2011 | Madurawe | H03K 19/1735 326/37 |
| 2012/0200345 A1 | 8/2012 | Kim | |
| 2012/0242392 A1 | 9/2012 | Kim | |

FOREIGN PATENT DOCUMENTS

| | | |
|---|---|---|
| EP | 1755223 A2 | 2/2007 |
| WO | 2014144830 A1 | 9/2014 |

OTHER PUBLICATIONS

International Search Report and Written Opinion for International Application PCT/US2014/029404, report completed Aug. 21, 2014, dated Aug. 21, 2014, 10 Pgs.

Extended European Search Report for European Application No. 14764631.9, Search completed Oct. 27, 2016, dated Nov. 7, 2016, 11 Pgs.

* cited by examiner

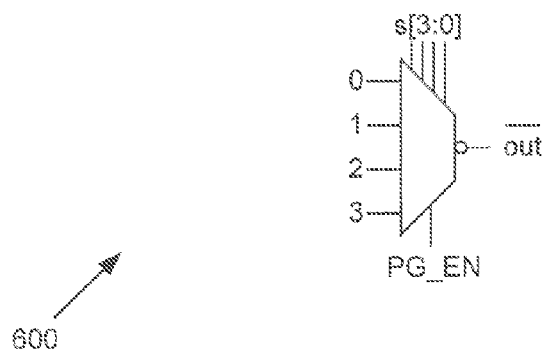
FIG. 6A
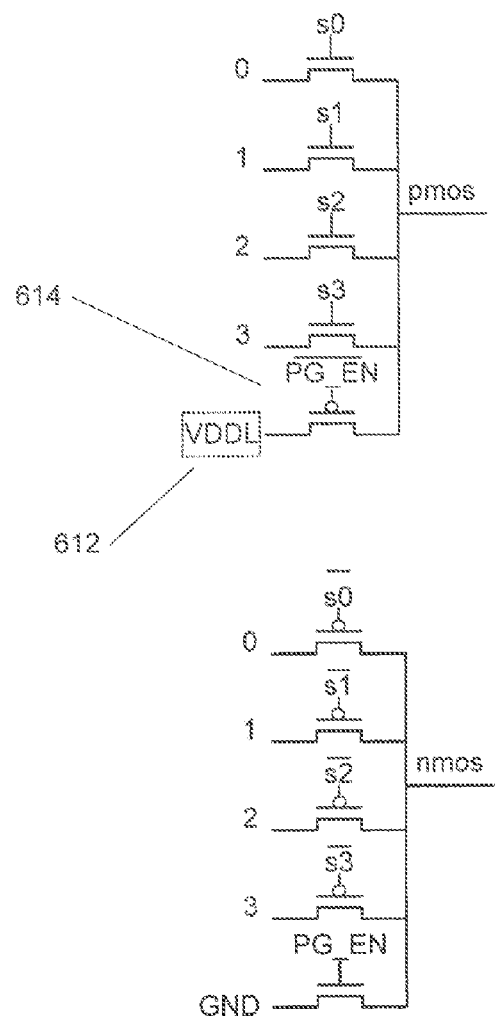
FIG. 6B
FIG. 6C

FINE-GRAINED POWER GATING IN FPGA INTERCONNECTS

CROSS-REFERENCE TO RELATED APPLICATIONS

This application is a national stage application under 35 U.S.C. § 371 of International Application No. PCT/US2014/029404, titled "Fine-Grained Power Gating in FPGA Interconnects," filed on Mar. 14, 2014, which claims priority to U.S. Provisional Patent Application No. 61/791,243, titled "Fine-Grained Power Gating Circuitry in FPGA Interconnects," filed Mar. 15, 2013, the contents of which are incorporated herein by reference.

GOVERNMENT LICENSE RIGHTS

This invention was made with Government support under N66001-09-1-2029, awarded by the U.S. Navy, Space and Naval Warfare Systems Command. The Government has certain rights in this invention.

FIELD OF THE INVENTION

The present inventions are directed to circuitry of and techniques for power reduction in logic and computing circuitry employed for signal selection and routing in circuitry including (but not limited to) processors, state machines, gate arrays, programmable gate arrays, field programmable gate arrays (FPGAs), and system-on-chips (SOCs). For example, the systems and methods of the present inventions may be implemented in or for fine-grained power gating in FPGA interconnects. While the inventions and/or embodiments are often described below in the context of FPGA circuitry, such discussion, inventions and/or embodiments are also applicable to logic and/or computing circuitry including (but not limited to) processors, state machines, gate arrays, programmable gate arrays and SOCs. For the sake of brevity, a separate discussion for each and every logic and/or computing circuit is not provided with respect to each aspect of the disclosed invention; however the applicability should be clear to one of ordinary skill in the art based on the instant disclosure.

BACKGROUND

A Field-Programmable Gate Array (FPGA) is an integrated circuit designed to be configured by a customer or a designer after being manufactured. The FPGA configuration is generally specified using a hardware description language (HDL). Contemporary FPGAs have large resources of logic gates and random access memory (RAM) blocks to implement complex digital computations. FPGAs typically contain programmable logic components called "configurable logic blocks" (CLB) or "logic array blocks" (LAB), and a network of reconfigurable interconnects that allow the blocks to communicate with each other. Logic blocks can be configured to perform complex combinational functions, or merely simple logic gates like AND and XOR. In most FPGAs, the logic blocks also include memory elements, which may be simple flip-flops or more complete blocks of memory.

An application circuit can be mapped into an FPGA provided that adequate resources are available. While the number of CLBs/LABs and I/Os required can be readily determined from the design, the number of routing tracks needed may vary considerably even among designs with the same amount of logic. For example, implementing a crossbar switch typically requires much more routing resources than a systolic array of the same gate count. Since unused routing tracks increase the cost (and decrease the performance) of the part without providing any benefit, FPGA manufacturers try to provide just enough tracks so that most designs that will fit in terms of Lookup tables (LUTs) and IOs can be routed. This is determined by estimates such as those derived from Rent's rule or by experiments with existing designs.

The FPGAs contain various computing elements that communicate with each other in performing operations where the signals are sent over routing channels composed of wires. Interconnect routing switches (primarily implemented as static multiplexers) allow for high-speed communications over long distances. Indeed, such interconnect routing switches often comprise the majority of the silicon area on a FPGA and can be very power hungry. Static multiplexers are used within the interconnects to switch signals between wires. In operation, the majority of static multiplexers are idle in a configured FPGA.

Generally, static multiplexers are devices that can select one of several input signals and forward the selected input to a single line output. In many applications, multiplexers are used to allow multiple signal sources to communicate over the same channel, although only one source may communicate at a time. A 4-input static multiplexer is illustrated in FIGS. 1A-C. The multiplexer 100 has four inputs 102 and four select bits 106 that can be used to select the output 104. FIGS. 1B and 1C illustrate two implementations of the multiplexer 100 where the select functions are implemented either with a positive trigger 112 (implementation 110) or with an inverted negative trigger 122 (implementation 120), respectively.

Typically, an inverter is placed at the output of the multiplexer to improve the signal driving capability of the multiplexer. A 4 input static multiplexer utilizing an inverter is illustrated in FIGS. 1D-E. The multiplexer 130 includes inputs 132 and four separate select bits 134, where only one of the select bits is allowed to turn on and pass an input that is inverted using an inverter 136 resulting in the output 138. FIGS. 1D and 1E illustrate two implementations of multiplexer 130 where the select functions are implemented either with a positive trigger in 140 or with an inverted negative trigger in 150, respectively. The implementation 150 illustrates an inverter 152 where the inverter can be supplied by a lower supply voltage (VDDL) 154 relative to a higher supply voltage (VDDH) 156 driving the memory cells of the select bits. Generally, driving memory cells at a slightly higher supply voltage (VDDH) while having the logic inverters and/or buffers at a lower supply voltage (VDDL) can improve performance and reduce power consumption.

When executing mapped designs, an FPGA can often have unused resources, resulting in current leakage. To alleviate the problem of leakage in both the CLB/LAB and the interconnect network, the unused blocks can be power gated to turn off their circuitry when not being utilized. Power gating can be achieved by adding a footer transistor that turns off the block during power gating mode (i.e. "sleep" mode). A 4-input static multiplexer with an output inverter and power gating is illustrated in FIGS. 2A-C. The multiplexer 200 includes a power gating enable signal input 202 that is turned on (or off depending on the implementation) during power gating mode. Traditionally, power gating utilizes a footer transistor 222 that is relatively large in size (compared to the size of output inverter transistors) that is stacked with the inverter transistor 224 as illustrated in FIG. 2C.

SUMMARY OF THE INVENTION

Turning now to the drawings, systems and methods for power gating in logic and/or computing circuitry employed for signal selection and routing in accordance with embodiments of the inventions are disclosed. In one embodiment, a multiplexer for fine-grain power gating includes a first supply voltage and a second supply voltage, where the first supply voltage is greater than or equal to the second supply voltage, a plurality of inputs, a plurality of selection inputs, a selection circuitry configured to select one of the plurality of inputs based upon the plurality of selection inputs, where one of the plurality of inputs is the first supply voltage and one of the selection inputs is a power gating enable input, an output inverter stage including a PMOS transistor and an NMOS transistor connected in series between the second supply voltage and a reference voltage, where at least one input to the inverter stage is provided to the gates of the PMOS and NMOS transistors and the connection between the PMOS and NMOS transistors forms an inverted output, and wherein the selection circuitry is configured so that selection of the power gating enable signal applies the first supply voltage to the gate of the PMOS transistor and places the PMOS transistor in a cutoff mode of operation.

BRIEF DESCRIPTION OF THE DRAWINGS

In the course of the detailed description to follow, reference will be made to the attached drawings. These drawings show different aspects of the present inventions and, where appropriate, reference numerals are utilized to make specific references. It is understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate the embodiment or embodiments is/are "example" embodiment(s) of, for example, the present inventions.

FIGS. 6A-D are schematic diagrams of a 4-input static multiplexer with an output inverter and tri-state power gating designed for a power-on sequence where VDDL remains off until memory is programmed in accordance with an embodiment of the invention.

DETAILED DESCRIPTION

Turning now to the drawings, systems and methods for power gating in logic and/or computing circuitry employed for signal selection and routing in accordance with embodiments of the inventions are illustrated. In many embodiments, an N-input static multiplexer includes s[N−1:0] select-bits that control which input signal is passed to an inverter. In various embodiments, the N-input static multiplexer also includes an additional power gating enable input that can be selected to drive transistors in an inverter stage of the N-input static multiplexer into cutoff and reducing leakage current without the need for a larger footer transistor. In several embodiments, power gating circuitry can be configured to achieve power gating of a N-input static multiplexer prior to the multiplexer initiating a power-on sequence to avoid the potential for the multiplexer to occupy a high power state prior to configuration as further discussed below.

In various embodiments, a static multiplexer can utilize a tri-state mode where inputs to an output inverter (and/or buffer) can be separated into PMOS and NMOS inputs during power gating. In many embodiments, the separated PMOS and NMOS inputs can be joined by a minimum-size high threshold-voltage (HVT) transmission gate that functions as a so-called keeper. During power gating, PG-EN can be set to 1 and the keeper set to off thereby driving the PMOS and NMOS signals to opposite polarities, 1 and 0, respectively. Such configurations can reduce leakage current of the PMOS transistor and also turn off the NMOS transistor and thus when the output inverter enters tri-state mode current does not leak through other pass gates. Further, when one of the select bits s[N−1:0] is turned on, power gating is disabled.

In many embodiments, the ability to implement power gating with comparatively small transistors enables the implementation of power efficient interconnects. As described above, while the embodiments of the invention are often described in the context of FPGA circuitry, embodiments of the invention can also be interpreted using applicable logic and/or computing circuitry including (but not limited to) processors, state machines, and gate arrays, programmable gate arrays and SOCs. For the sake of brevity, a separate discussion for each and every logic and/or computing circuit is not provided with respect to every aspect of the disclosed invention; however the applicability should be clear to one of ordinary skill in the art based on the instant disclosure. Various multiplexers for power gating in accordance with embodiments of the invention are further discussed below.

Efficient Power Gating

Figure 1A:
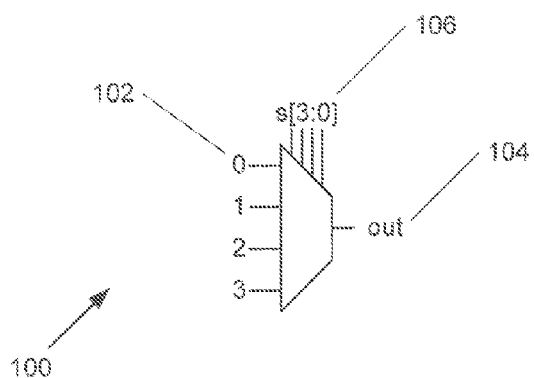
FIGS. 1A-C are schematic diagrams of a 4-input static multiplexer.
Figure 1B:
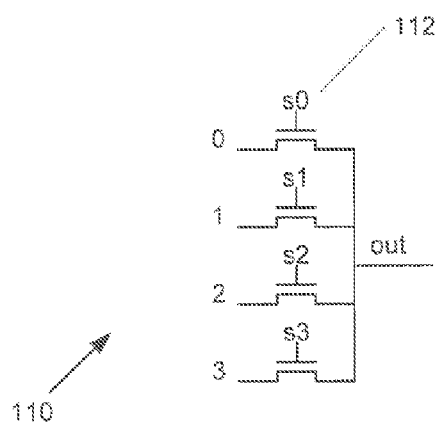
Figure 1C:
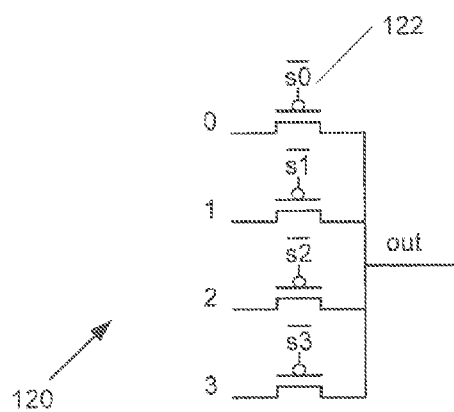
Figure 1D:
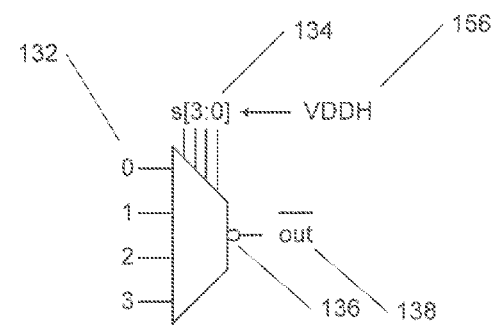
FIGS. 1D-F are schematic diagrams of a 4-input static multiplexer with an output inverter.
Figure 1E:
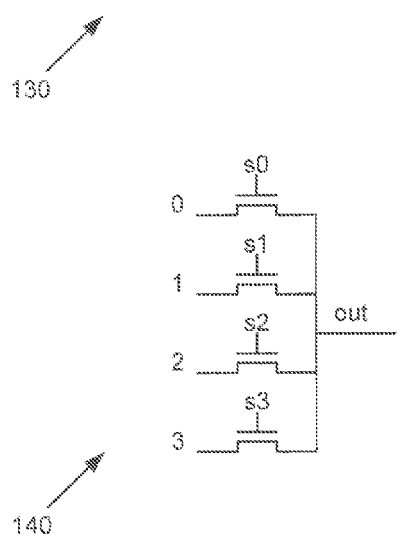
Figure 1F:
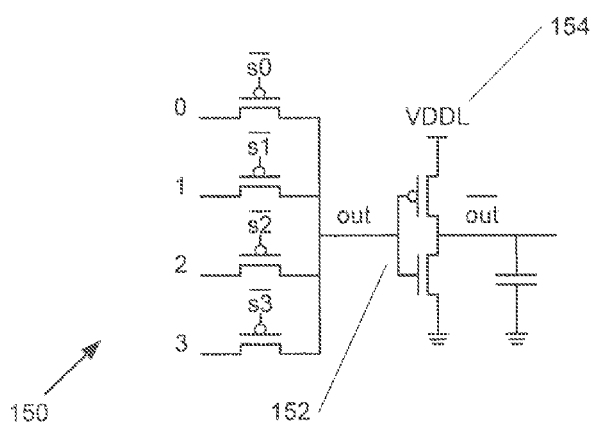
Figure 2A:
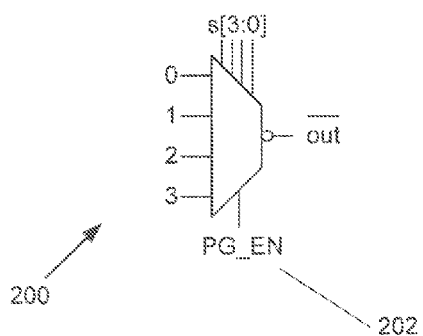
FIGS. 2A-C are schematic diagrams of a 4-input static multiplexer with an output inverter and power gating.
Figure 2B:
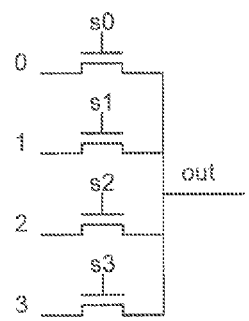
Figure 2C:
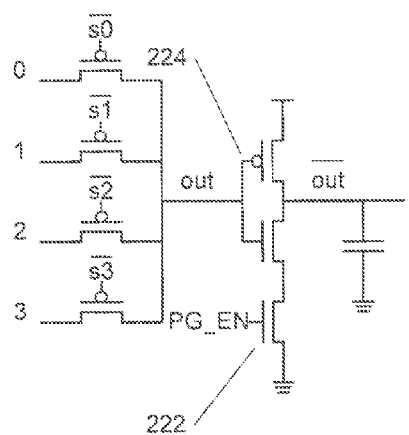

Leakage current within FPGAs can contribute to significant losses of power during operation. In many embodiments, power gating in FPGAs can be implemented by turning off the output driver of a multiplexer when it is not in use—thereby reducing the power consumption. Traditionally, power gating utilizes a footer transistor that is relatively large in size (comparable to the size of one of the transistors in the output inverter) that is stacked with the inverter transistor as illustrated in FIG. 2C and described above.

Figure 3A:
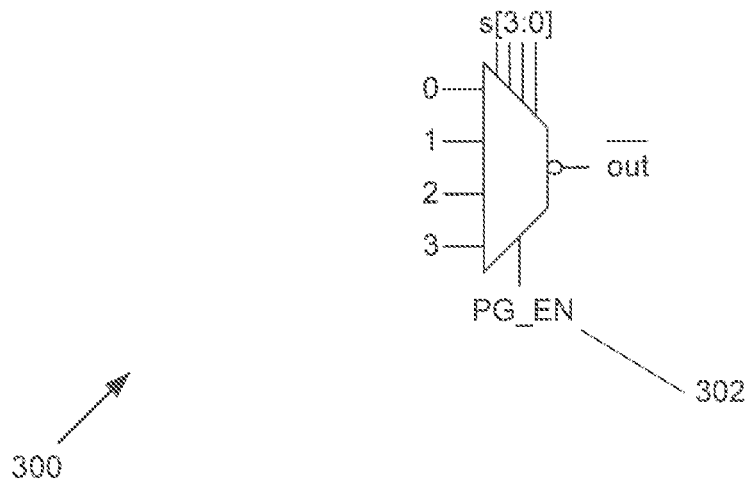
FIGS. 3A-D are schematic diagrams of a 4-input static multiplexer with an output inverter and power gating in accordance with an embodiment of the invention.
Figure 3B:
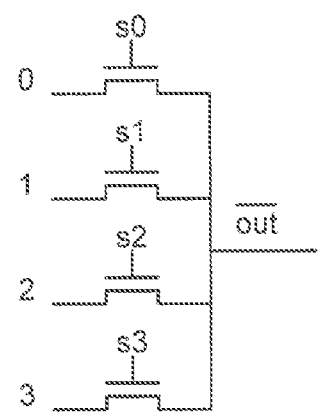
Figure 3C:
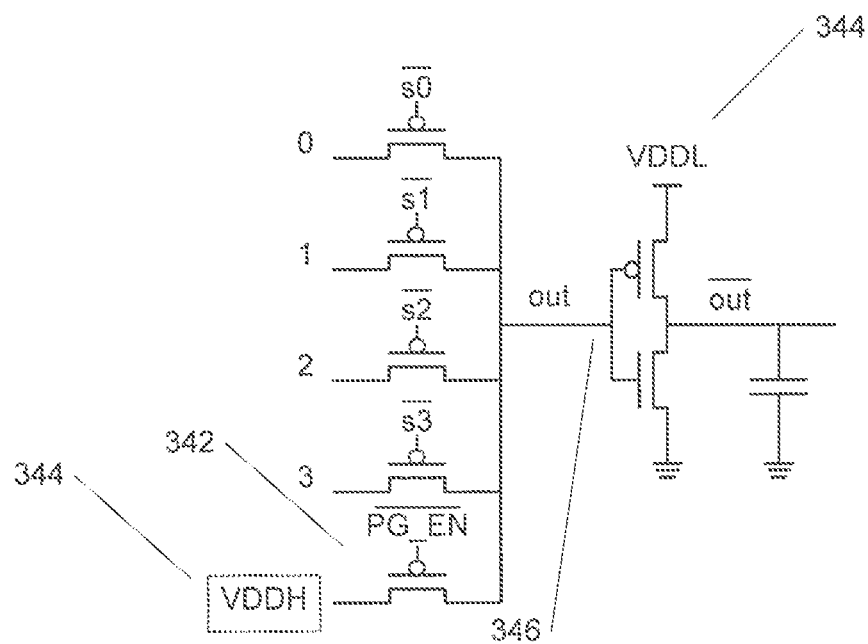
Figure 3D:
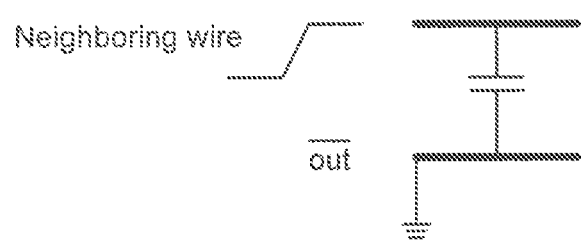

In many embodiments of the invention, voltage drops (i.e. differences) can be controlled between various transistors within an output inverter stage of a multiplexer while power gating. An exemplary 4-input static multiplexer with an inverted output utilizing power gating to reduce current leakage in accordance with an embodiment of the invention is illustrated in FIGS. 3A-D. The static multiplexer 300 includes a PG_EN input signal 302. As illustrated in FIG. 3C, the PG_EN input signal can be implemented as an input driving a PMOS pass-gate 342. During power gating, the select bits and PG_EN can be programmed to 0, driving the gate input 346 to the inverter to VDDH 344 which can be slightly above the supply voltage of the inverter VDDL 344. The voltage drops between various transistors can reduce leakage current of the PMOS transistor and thus reduce current leakage of the inverter. In such embodiments, a so-called reference voltage can be defined as VDDH and can drive the transistors of the inverter as described above. However, such an implementation can result in the NMOS transistor of the inverter remaining on and driving the output of the inverter to 0. Further, an output wire driven to 0 does not reduce the coupling capacitance experience by neighboring wires as illustrated in FIG. 3D.

In many embodiments, power gating can also be achieved by controlling the source gate voltage drop of the NMOS and PMOS transistors within an output inverter stage of a multiplexer by using the multiplexers to switch a gating signal (typically equal to a supply voltage) to the gate in one or both of the NMOS and PMOS transistors in the inverter output stage. In several embodiments, the signals provided to the gate of the NMOS and PMOS transistors can be separated so that they can be independently controlled to drive both transistors into cut-off and prevent leakage current.

Figure 4A:
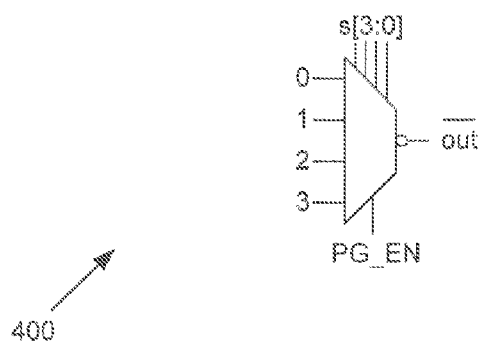
FIGS. 4A-E are schematic diagrams of a 4-input static multiplexer with an output inverter and tri-state power gating in accordance with an embodiment of the invention.
Figure 4B:
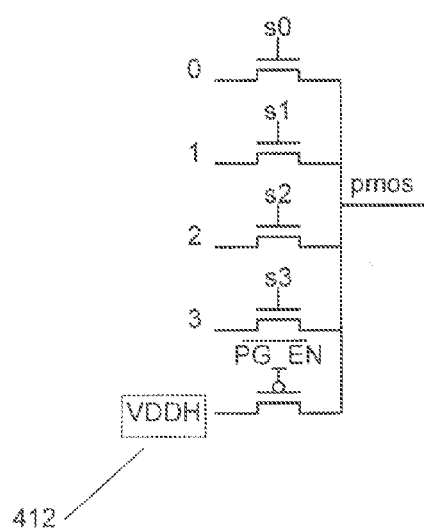
Figure 4C:
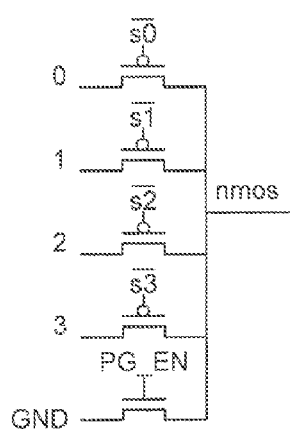
Figure 4D:
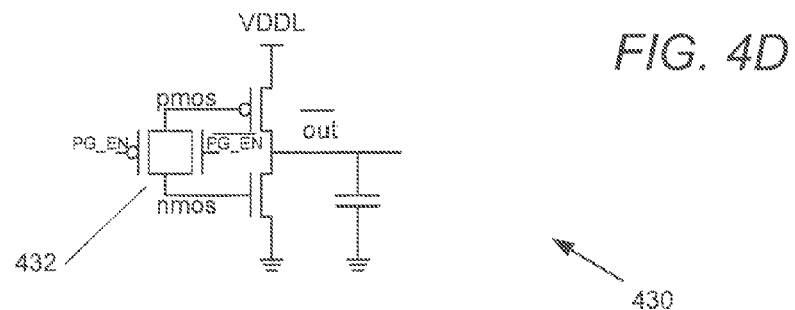
Figure 4E:
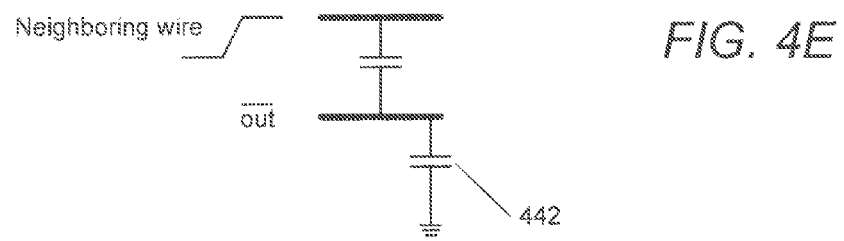

A 4-input static multiplexer with output inverter and tri-state power gating in accordance with an embodiment of the invention is illustrated in FIGS. 4A-E. The static multiplexer 400 can be implemented where inputs to an output inverter can be separated into PMOS and NMOS inputs as illustrated in FIGS. 4B and 4C, respectively. In various embodiments, the PMOS and NMOS inputs can be joined by a minimum-sized, high threshold voltage (HVT) transmission gate as the keeper 432 of the output inverter 430 as illustrated in FIG. 4D. Other types of transistors and transmission gates can also be used to perform a similar function. In several embodiments, during power gating. PG_EN can be set to 1, the keeper can be off, driving the PMOS and NMOS signals to opposite polarities where the source PG_EN input, can be tied to VDDH 412 (or another signal from the VDDH voltage domain) as illustrated in FIG. 4B. Such configurations can reduce the leakage current of the PMOS transistor (and also turn off the NMOS transistor) and the output therefore enters tri-state mode during power gating. In such embodiments, the ground voltage drives the NMOS transistor while a reference voltage which can be defined as a VDDH signal (or a signal from the VDDH voltage domain) drives the PMOS transistor of the inverter as described above. Typically, the tri-state buffer will not cause leakage current though the other pass gates and will also reduce coupling capacitance experienced by neighboring wires by forming a capacitive divider 442 as illustrated in FIG. 4E.

Figure 4F:
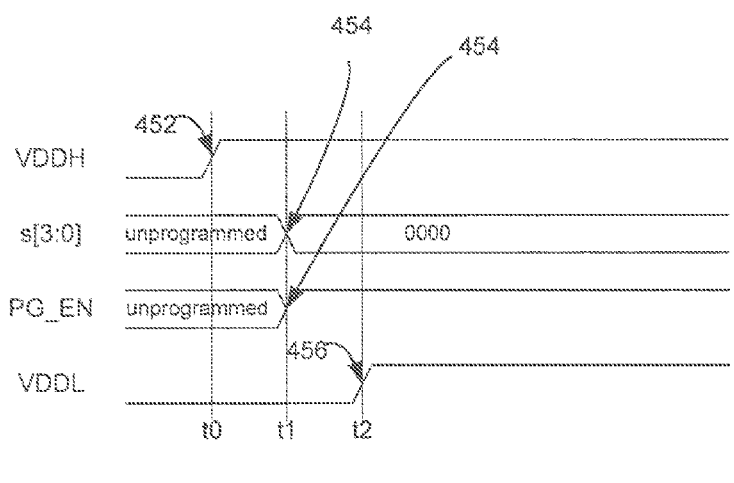
FIG. 4F is an exemplary timing relationship diagram of selected control signals for static multiplexers illustrated in FIGS. 4A-4D, in accordance with an embodiment of the invention; notably, this exemplary timing relationship diagram may also be employed in connection with the static multiplexers illustrated in FIGS. 3A-3D.

FIG. 4F illustrates an example timing diagram for the power-on sequence for circuits including (but not limited to) circuits utilized to implement the multiplexers as shown in FIGS. 3 and 4. In the timing diagram 450, upon power-up, the VDDH power domain is first enabled, identified by called 452, at time t0. The configuration circuitry used for providing the s[3:0] and PG_EN controls are then enabled to provide valid control signals, identified by callout 454, at time t1. In this example, the PG_EN is set to 1, and s[3:0]

are set to 0, thus enabling the power-gating mode. In other examples, PG_EN can be set to 0, and s[3:0] can have some of its values set to 1 to select an active input, in this case 0-3, thus enabling the active mode. Finally, VDDL is powered on, identified by call out 456, at time t2, to start normal circuitry operation of the multiplexers.

Although specific examples of static multiplexers with an output inverter and power gating are discussed above with respect to FIGS. 3A-D and 4A-D, any of a variety of static multiplexers configurations including (but not limited to) various inputs and outputs as appropriate to the requirements of a specific application can be utilized in accordance with embodiments of the invention.

Power Gating Using VDDL to Reduce Current Leakage

In some applications, it may be advantageous that the logic does not enter a high-power state prior to being programmed (i.e. entering the power-on sequence). In an unprogrammed multiplexer, static current flow causing high-power states can occur when two branches are conducting and connected to two separate voltage levels.

Figure 5A:
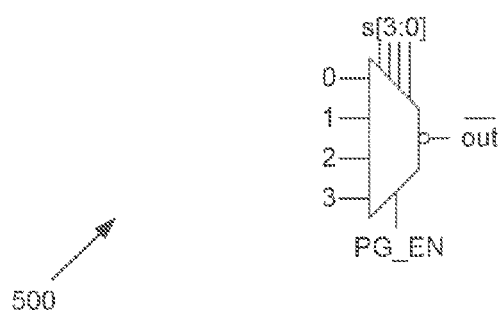
FIGS. 5A-C are schematic diagrams of a 4-input static multiplexer with an output inverter and power gating designed for a power-on sequence where VDDL remains off until memory is programmed in accordance with an embodiment of the invention.
Figure 5B:
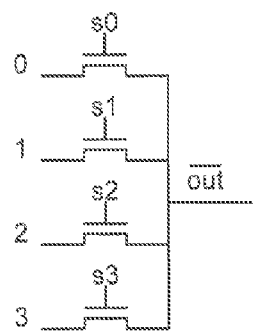
Figure 5C:
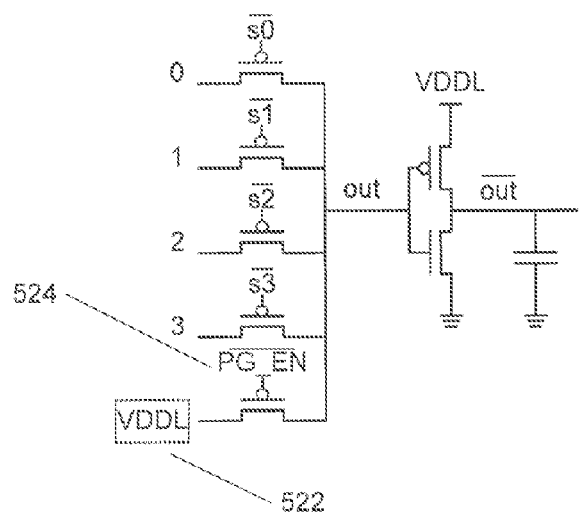

A 4-input static multiplexer with an output inverter and power gating designed for a power-on sequence where VDDL remains off until memory is programmed in accordance with an embodiment of the invention is illustrated in FIGS. 5A-C. In many embodiments, the multiplexer 500 does not draw any static current even in the unprogrammed state. In various embodiments, VDDL 522 remains off until memory is programmed.

A 4-input static multiplexer with output inverter and tri-state power gating designed for a power-on sequence where VDDL remains off until memory is programmed in accordance with an embodiment of the invention is illustrate in FIGS. 6A-D. In various embodiments, the multiplexer 600 has a power gating input where the inputs to the output inverter are separated into PMOS and NMOS inputs, joined by a minimum-sized, high threshold voltage (HVT) transmission gate as the keeper 642, as one implementation. Other types of transistors and transmission gates can also be used to perform this function. As discussed above, the PG_EN inputs (identified by callouts 524 in FIG. 5C and 614 FIG. 6B) can be tied to VDDL (identified by callouts 522 in FIG. 5C and 612 in FIG. 6B) or another signal from the VDDL voltage domain, where VDDL remains off until memory is programmed.

Figure 6D:
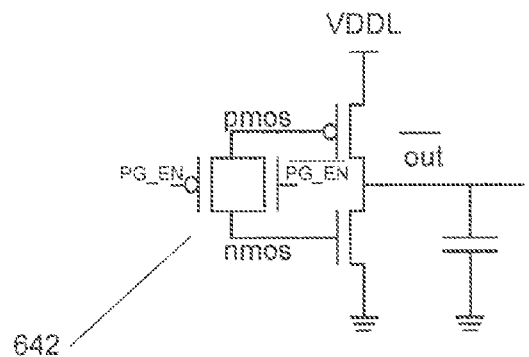
Figure 6E:
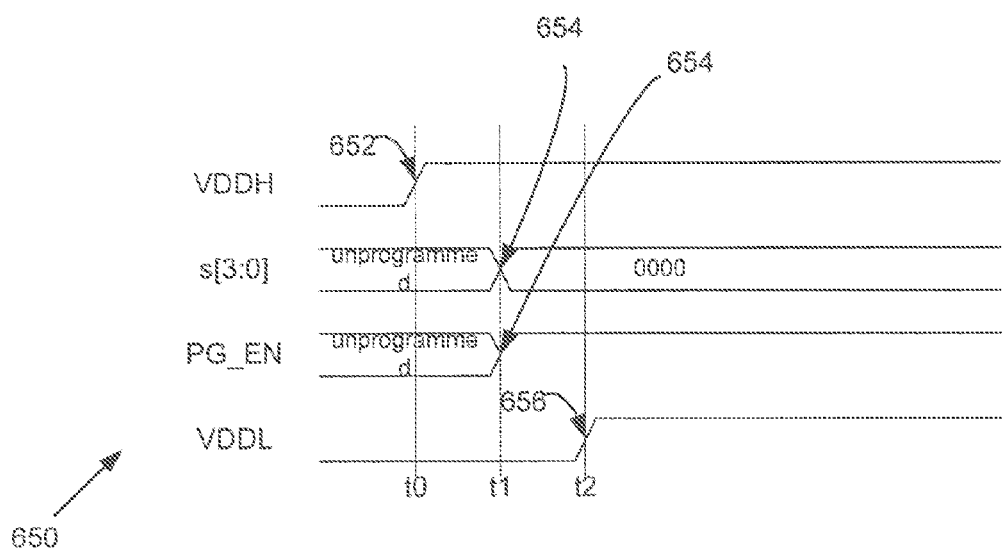
FIG. 6E is an exemplary timing relationship diagram of selected control signals for static multiplexers illustrated in FIGS. 6A-6D, in accordance with an embodiment of the invention; notably, this exemplary timing relationship diagram may also be employed in connection with the static multiplexers illustrated in FIGS. 5A-5C.

FIG. 6E illustrates an example timing diagram for the power-on sequence for circuits including (but not limited to) circuits utilized to implement the multiplexers shown in FIGS. 5A-C and 6A-D. In timing diagram 650, upon power-up, the VDDH power domain can be enabled, identified by callout 652 at time t0. The configuration circuitry used for providing the s[3:0] and PG_EN controls can then be enabled to provide valid control signals, identified by callout 654, at time t1. In this example, the PG_EN is set to 1, and s[3:0] are set to 0, thus enabling the power-gating mode. In other examples, PG_EN can be set to 0, and s[3:0] can have some of its values set to 1 to select an active input, in this case 0-3, thus enabling the active mode. At time t2, VDDL is powered on, identified by callout 656, to start normal circuitry operation of the multiplexer.

Although specific examples of static multiplexers with output inverter and power gating designed for a power-on sequence where VDDL remains off until the memory is programmed are discussed above with respect to FIGS. 5A-C and 6A-D, any of a variety static multiplexer configurations including (but not limited to) various inputs and outputs as appropriate to the requirements of a specific application can be utilized in accordance with embodiments of the invention. Power gating utilizing a third voltage source in accordance with embodiments of the invention is further discussed below.

Power Gating Using $VDDH_{LATE}$ in FPGAs to Reduce Current Leakage

As described above, it may be advantageous that the logic does not enter a high-power state before being programmed. In many embodiments of the invention, the source input of the PG_EN signal can be tied to a $3^{rd}$ VDD domain ($VDDH_{LATE}$) which remains set to 0 until after memory (for example, the SRAMs) are programmed.

Figure 7A:
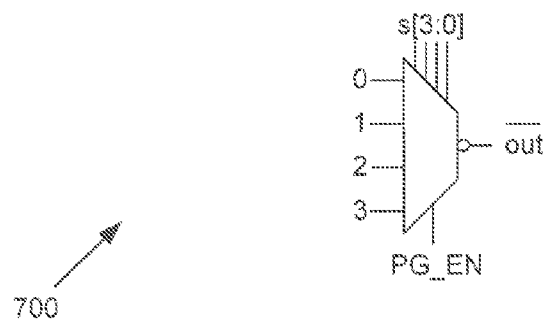
FIGS. 7A-C are schematic diagrams of a 4-input static multiplexer with output inverter and power gating designed for a power-on sequence where VDDL and $VDDH_{LATE}$ remain off until memory is programmed in accordance with an embodiment of the invention.
Figure 7B:
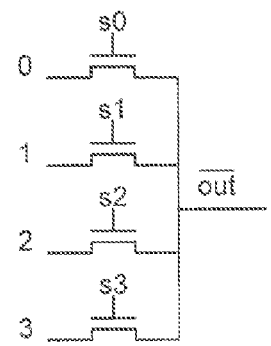
Figure 7C:
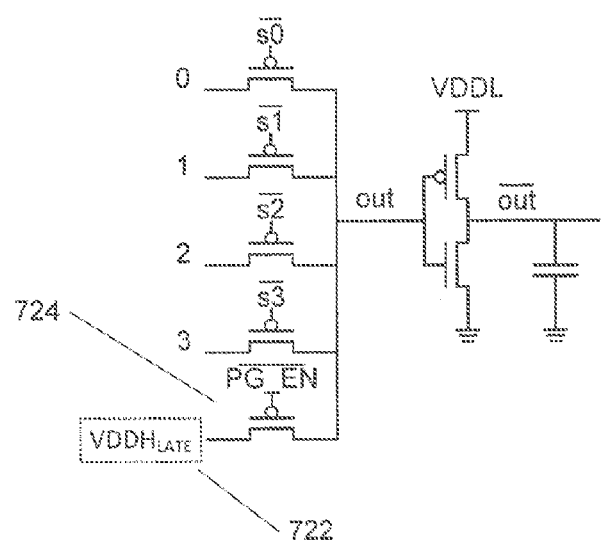

A 4-input static multiplexer with output inverter and power gating designed for a power-on sequence where VDDL and $VDDH_{LATE}$ remains off until memory is programmed in accordance with an embodiment of the invention is illustrate in FIGS. 7A-C. In many embodiments, before the memory associated with multiplexer 700 is programmed, only VDDH is turned on to program the memory, while both VDDL and $VDDH_{LATE}$ 722 can be turned off. In several embodiments, VDDL and $VDDH_{LATE}$ can be turned on only after the memory is programmed to ensure no high-power state is caused by unprogrammed multiplexers. In various embodiments, the $VDDH_{LATE}$ voltage domain can by supplied by an external power supply, or be powered from VDDH by using additional power gating circuitry. The PG_EN input 724 can be tied to $VDDH_{LATE}$ 722 or another signal from the $VDDH_{LATE}$ voltage domain as discussed above.

Figure 8A:
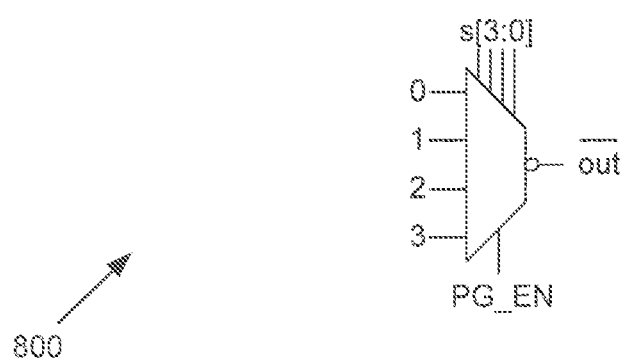
FIGS. 8A-D are schematic diagrams of a 4-input static multiplexer with output inverter and tri-state power gating designed for a power-on sequence where VDDL and $VDDH_{LATE}$ remain off until memory is programmed in accordance with an embodiment of the invention.
Figure 8B:
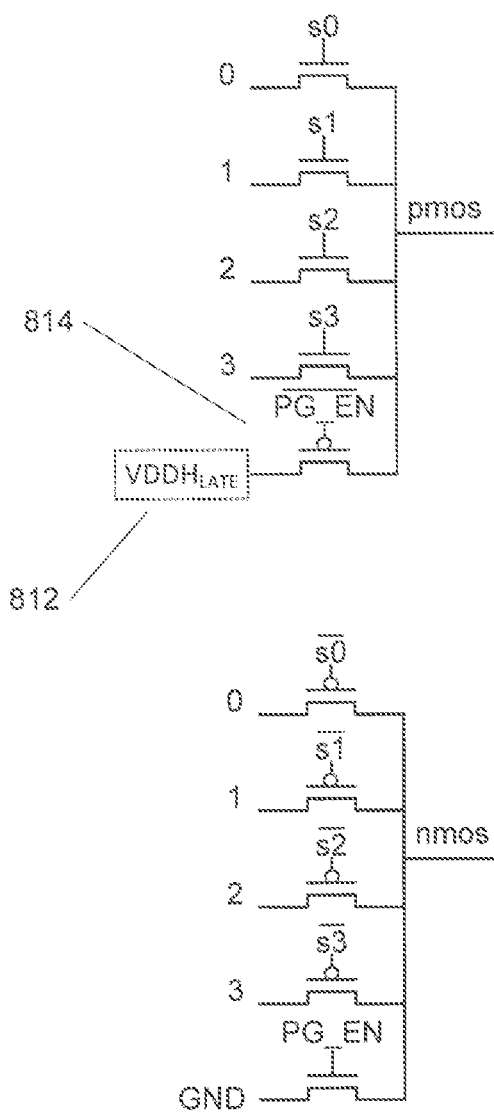
Figure 8C:
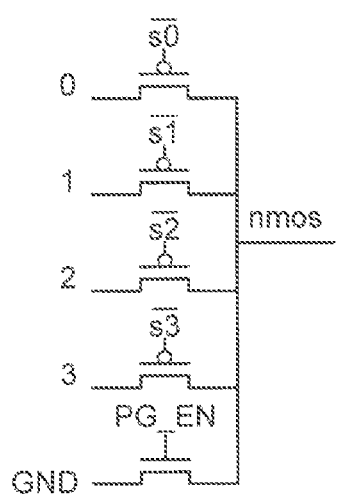
Figure 8D:
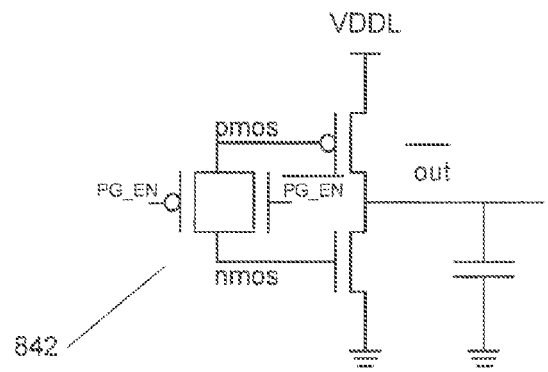

A 4-input static multiplexer with output inverter and tri-state power gating designed for a power-on sequence where VDDL and $VDDH_{LATE}$ remain off until configuration circuitry (which may include memory or other storage elements) is initialized is illustrated in FIGS. 8A-D. In many embodiments, before the memory associated with multiplexer 800 is programmed, only VDDH is turned on to program the memory, while both VDDL and $VDDH_{LATE}$ 812 can be turned off. In various embodiments, the inputs to the output inverter can be separated into PMOS and NMOS inputs, joined by a minimum-sized, high threshold voltage (HVT) transmission gate as the keeper 842 as illustrated in FIG. 8D and as discussed above. Other types of transistors and transmission gates may be implemented or can also be used to perform this function. The PG_EN input 814 can be tied to $VDDH_{LATE}$ 812 or another signal from the $VDDH_{LATE}$ voltage domain as discussed above.

Figure 8E:
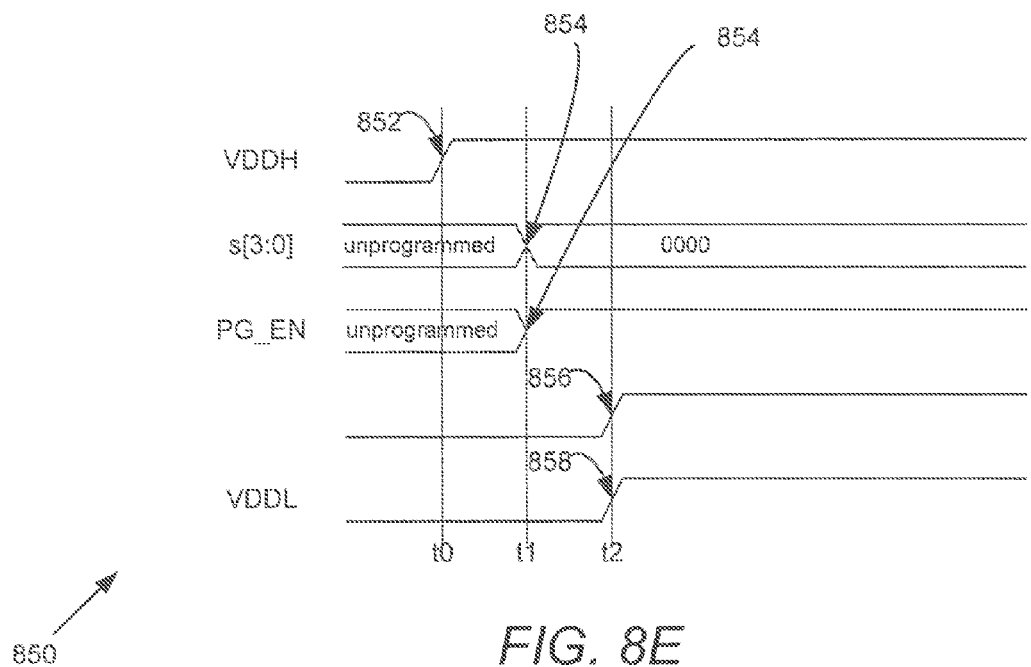
FIG. 8E is an exemplary timing relationship diagram of selected control signals for static multiplexers of FIGS. 8A-8D, in accordance with an embodiment of the invention; notably, this exemplary timing relationship diagram may also be employed in connection with the static multiplexers illustrated in FIGS. 7A-7C.

FIG. 8E illustrates an example timing diagram for the power-on sequence for circuits including (but not limited to) circuits utilized to implement the multiplexers shown in FIGS. 7A-C and 8A-D. In the timing diagram 850, upon power-up, the VDDH power domain can be enabled, identified by callout 852, at time t0. The configuration circuitry used for providing the s[3:0] and PG_EN controls can then be enabled to provide valid control signals, identified by callout 854, at time t1. In this example, PG_EN is set to 1, and s[3:0] are set to 0, thus enabling the power-gating mode. In other examples, PG_EN can be set to 0, and s[3:0] can have some of its values set to 1 to select an active input, in this case 0-3, thus enabling the active mode. Finally, $VDDH_{LATE}$ and VDDL can be powered on, identified by arrows 856 and 858, respectively, at time t2, to start normal circuitry operation of the multiplexers.

Although specific examples of static multiplexers with output inverter and power gating designed for a power-on sequence in FPGAs are discussed above with respect to FIGS. 7A-C and 8A-E, any of a variety static multiplexer configurations including (but not limited to) various inputs and outputs as appropriate to the requirements of a specific application can be utilized in accordance with embodiments of the invention. Importantly, although many of the exemplary multiplexers have been described herein in the content of 4-inputs, the inventions are not limited to any number of inputs of the multiplexers. Rather, many embodiments of the present invention may be implemented as n-input multiplexers (where n is a whole number that is greater than 0, in cases when n=1, this invention can be used as a signal buffer with power gating). Control mechanisms for power gating in multiplexers in accordance with embodiments of the invention are further discussed below.

Control Circuitry for Power Gating

Figure 9:
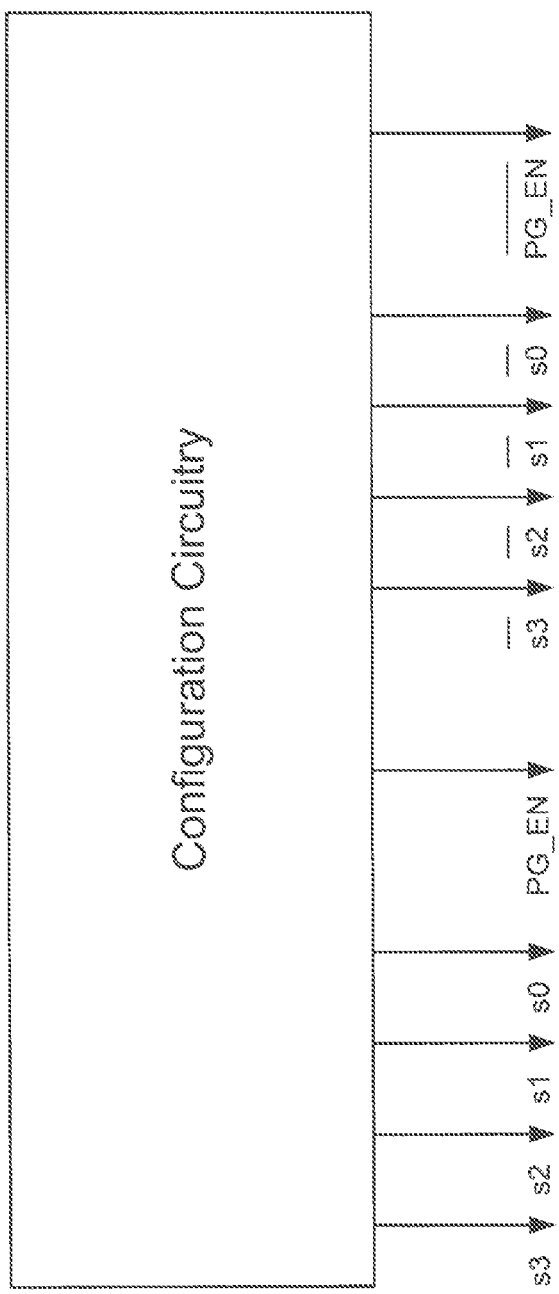
FIG. 9 is a block diagram representation of configuration circuitry used to generate both the real-and-complement control signals for s[3:0] and PG_EN: notably, the configuration circuitry may include discrete and/or integrated logic, and/or, for example, one or more memory or storage elements, state machines, processors (suitably programmed) and/or field programmable gate arrays (or combinations of the aforementioned) in accordance with an embodiment of the invention.

In many embodiments, the configuration circuitry can be initialized by the control circuitry as illustrated in FIG. 9. The control circuitry 900 may also program or re-program (for example, in situ) the configuration circuitry via modification of the configuration bits if a new configuration is desired. Notably, the configuration circuitry to generate signals (having appropriate timing relationships) to set or control the multiplexers, switches and power gating circuitry may be implemented via discrete or integrated logic, and/or one or more memory or storage elements (for example, SRAM, Flash and/or MRAM to store configuration or state data), state machines, processors (suitably programmed) and/or field programmable gate arrays (or combinations of the aforementioned); indeed, any circuitry (for example, discrete or integrated logic, memory or storage element, state machine(s), processor(s) (suitably programmed) and/or field programmable gate array(s) (or combinations of the aforementioned)) now known or later developed may be employed in conjunction with the inventive switches and power gating circuitry and, as such, is intended to fall within the scope of the present inventions.

Figure 10A:
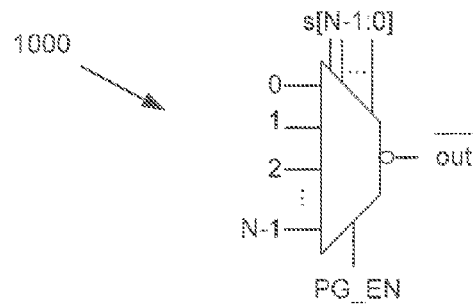
FIGS. 10A-C are schematic diagrams of an N-input static multiplexer with an output inverter and power gating in accordance with an embodiment of the invention.
Figure 10B:
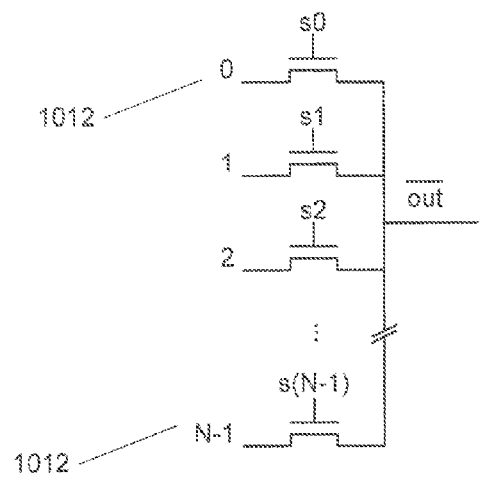
Figure 10C:
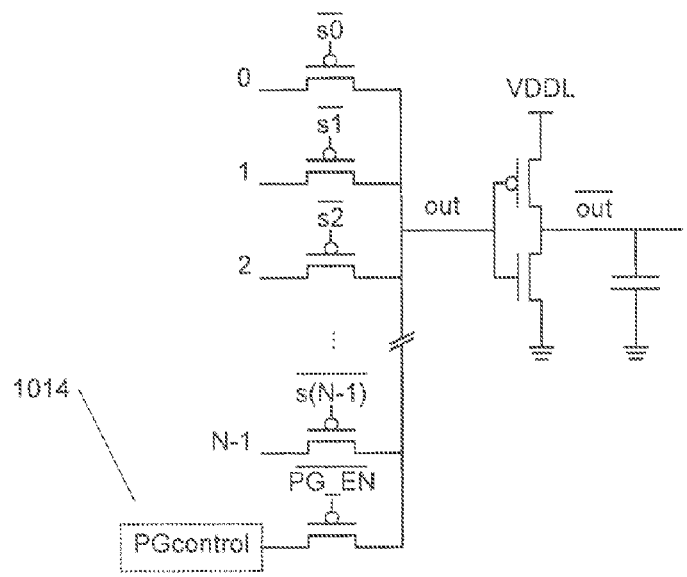

FIGS. 10A-C are schematic diagrams of an N-input static multiplexer with an output inverter and power gating in accordance with an embodiment of the invention. The N-input static multiplexer 1000 includes N inputs 1012. As shown in FIG. 10B, the PG control signal 1014 can be VDDH, VDDL, or $VDDH_{LATE}$, or another signal from those voltage domains, configured in a similar fashion as those voltage domains described above regarding FIG. 3C, FIG. 5C, and FIG. 7C. The N-input static multiplexer can receive N configuration bits, plus controls for power gating.

Figure 10D:
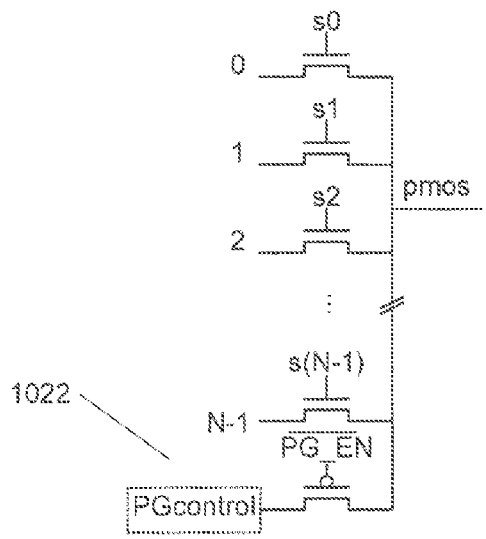
FIGS. 10D-F are schematic diagrams of an N-input static multiplexer with an output inverter and tri-state power gating in accordance with an embodiment of the invention.
Figure 10E:
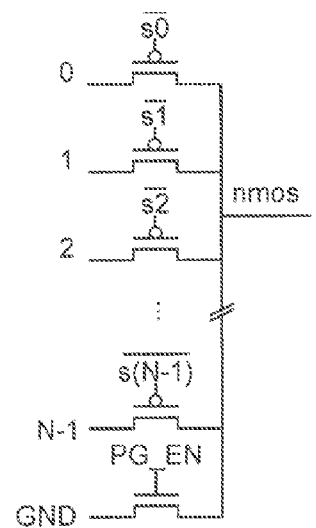
Figure 10F:
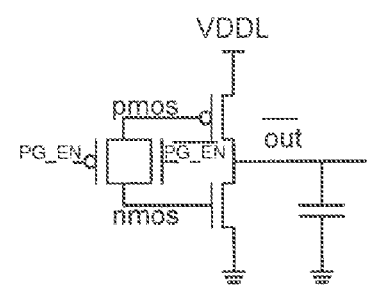

FIGS. 10D-F are schematic diagrams of an N-input static multiplexer with an output inverter and tri-state power gating in accordance with an embodiment of the invention. As illustrated in FIG. 10D, the PG control signal 1022, can be VDDH, VDDL, or $VDDH_{LATE}$, or another signal from those voltage domains, configured in a similar fashion as those voltage domains described above regarding FIG. 4B, FIG. 6B, and FIG. 8B.

Figure 10G:
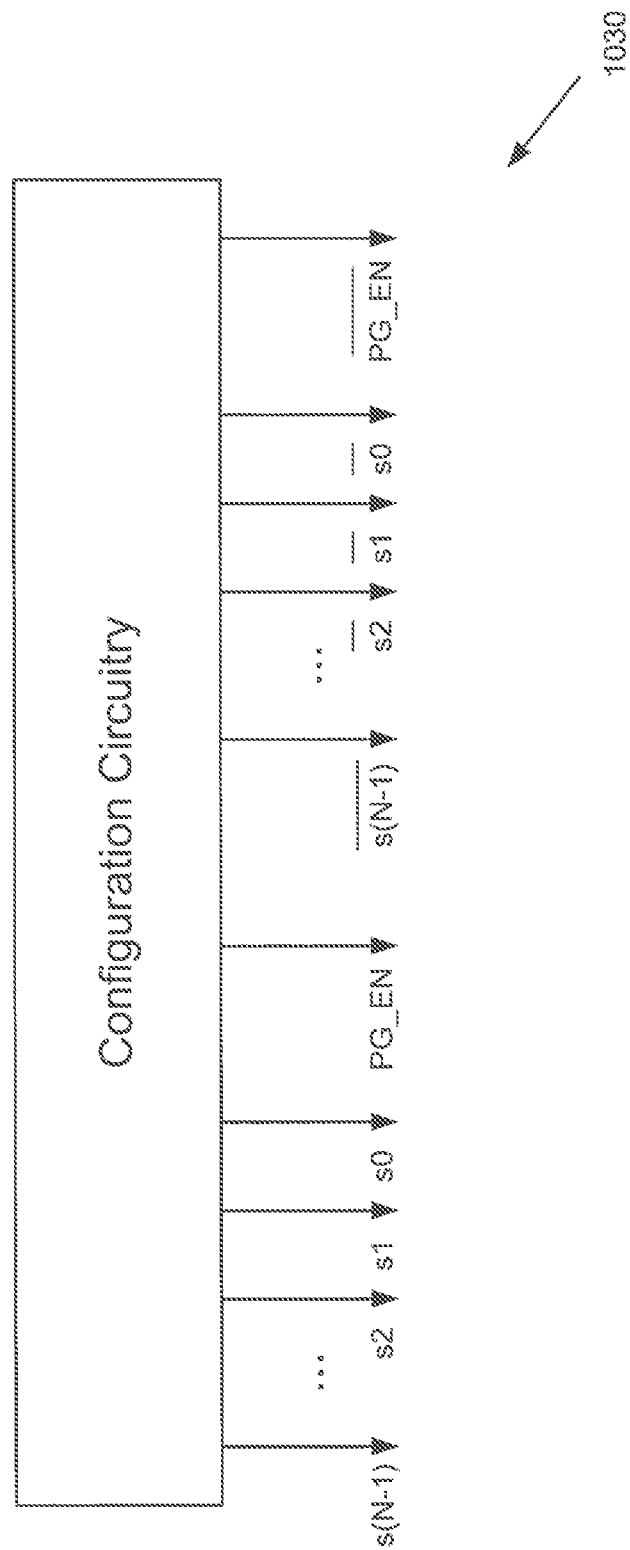
FIG. 10G is a block diagram representation of configuration circuitry used to generate both the real-and-complement control signals for s[N−1:0] and PG_EN; notably, the configuration circuitry may include discrete and/or integrated logic, and/or, for example, one or more memory or storage elements, state machines, processors (suitably programmed) and/or field programmable gate arrays (or combinations of the aforementioned) in accordance with an embodiment of the invention.

An N-input static multiplexer can receive N configuration bits, plus controls for power gating. FIG. 10G is a block diagram representation of configuration circuitry used to generate both the real-and-complement control signals for s[N−1:0] and PG_EN; notably, the configuration circuitry may include discrete and/or integrated logic, and/or, for example, one or more memory or storage elements, state machines, processors (suitably programmed) and/or field programmable gate arrays (or combinations of the aforementioned) in accordance with an embodiment of the invention. The block diagram and signal interface for an exemplary configuration circuitry 1030 can be used to generate both the real-and-complement control signals for N0input static multiplexer as shown in FIGS. 10D-F.

Notably, the present inventions may be employed to form and/or instantiate switch networks or architectures for logic and/or computing circuitry including (but not limited to) processors, state machines, gate arrays, programmable gate arrays, FPGAs, and SOCs. For example, one or more of the inventive switches and multiplexers (including the control signals and buffers associated with such switches and multiplexers) described and illustrated herein may be employed in connection with the inventive networks or architectures described and/or illustrated in Provisional Application Ser. No. 61/786,676 ("'676 Provisional Application"), entitled "A Radix-3 Network Architecture for Boundary-less Hierarchical Interconnects", filed Mar. 15, 2013, which is incorporated in its entirety herein by reference. For example, in one embodiment, the inventive networks or architectures described and/or illustrated in the '676 Provisional Application may include one or more of the inventive switches and multiplexers (including the control signals and buffers associated with such switches and multiplexers) described and illustrated herein to form, generate and/or instantiate such inventive networks or architectures. Notably, all permutations and combinations of the switches and multiplexers described and illustrated herein may be employed to generate and instantiate the networks or architectures of the '676 Provisional Application. That is, one or more of the inventive switches and multiplexers described and illustrated herein may be employed in one or more of the switch and multiplexer blocks of a network similar to any one of the networks described in the '676 Provisional Application; all such combinations and permutations are intended to fall within the scope of the present inventions.

It should be further noted that the various circuits and circuitry disclosed herein may be described using computer aided design tools and expressed (or represented), as data and/or instructions embodied in various computer-readable media, for example, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). The present inventions are also directed to such representation of the circuitry described herein, and/or techniques implemented thereby, and, as such, are intended to fall within the scope of the present inventions.

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations and simulation instruction-based expressions using computer aided design, simulation and/or testing tools. The simulation of the inventive switches and multiplexers (including the control signals and buffers associated with such switches and multiplexers), which for example, may be incorporated in logic and/or computing circuitry, may be implemented by a computer system wherein characteristics and operations of such circuitry, and techniques implemented thereby, are simulated, imitated, replicated, analyzed and/or predicted via a computer system. The present inventions are also directed to such simulations and testing of the inventive switches and multiplexers (including the control signals and buffers associated with such switches and multiplexers), whether in situ or not; and, as such, are intended to fall within the scope of the present inventions. The computer-readable media and data corresponding to such simulations and/or testing tools are also intended to fall within the scope of the present inventions.

Although the present inventions have been described in certain specific aspects, many additional modifications and variations would be apparent to those skilled in the art. It is therefore to be understood that the present invention may be practiced otherwise than specifically described without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A multiplexer for fine-grain power gating comprising:
a first supply voltage input to receive a first supply voltage and a second supply voltage input to receive a second supply voltage, where the first supply voltage is greater than or equal to the second supply voltage;
a plurality of inputs;
a plurality of selection inputs;
a selection circuitry configured to select one of the plurality of inputs based upon the plurality of selection inputs, wherein the selection circuitry includes a plurality of pass transistors including a first power gate pass transistor, wherein each pass transistor includes an input which is associated with and coupled to at least one of the plurality of inputs and a gate which is associated with and coupled to at least one of the plurality of selection inputs, where one of the plurality of inputs is the first supply voltage which is coupled to the first power gate pass transistor and one of the selection inputs is a power gating enable input which is coupled to the first power gate pass transistor to enable the first power gate pass transistor;
an output inverter stage, coupled to outputs of the plurality of transistors of the selection circuitry, comprising a PMOS transistor and an NMOS transistor connected in series between the second supply voltage and a reference voltage, where at least one input to the output inverter stage is provided to the gates of the PMOS and NMOS transistors via one of the plurality of pass transistors of the selection circuitry and the connection between the PMOS and NMOS transistors forms an inverted output; and
wherein the selection circuitry is configured so that selection of the power gating enable signal applies the first supply voltage to the gate of the PMOS transistor and places the PMOS transistor in a cutoff mode of operation;

wherein:
the plurality of pass transistors of the selection circuitry includes a second power gate pass transistor;
one of the plurality of inputs is the reference voltage which is coupled to the second power gate pass transistor;
the at least one input to the output inverter stage comprises a PMOS inverter input provided to the gate of the PMOS transistor, where the first supply voltage is provided to the gate of the PMOS transistor via the PMOS inverter input and the first power gate pass transistor in response to selection of the power gating enable input to place the PMOS transistor in a cutoff mode of operation;
the at least one input to the output inverter stage comprises a NMOS inverter input provided to the gate of the NMOS transistor, where a signal from the reference voltage is provided to the gate of the NMOS transistor via the NMOS inverter input and the second power gate pass transistor in response to selection of the power gating enable input to place the NMOS transistor in a cutoff mode of operation;
a transmission gate connected between the gates of the PMOS and NMOS transistors and configured to isolate the gates of the PMOS and NMOS transistors in response to selection of the power gating enable input so that the PMOS inverter input and the NMOS inverter input separately drive the gates of the PMOS and NMOS transistors, respectively;
wherein at least one of the plurality of select inputs being set to a first state disables selection of the power gating enable input.

2. The multiplexer of claim 1, wherein the reference voltage is ground.

3. The multiplexer of claim 1, wherein the transmission gate is a high threshold voltage transmission gate.

4. The multiplexer of claim 1, further comprising:
control circuitry configured to drive the plurality of selection inputs, where the control circuitry comprises a memory configured to control the plurality of selection inputs to cause the selection circuitry to select a specific input from the plurality of inputs; and
wherein the first supply voltage does not supply power until a memory is programmed.

5. The multiplexer of claim 4, wherein the first supply voltage is supplied by an external power supply.

6. The multiplexer of claim 4, wherein the first supply voltage is supplied by power gating circuitry.

7. The multiplexer of claim 1, wherein the reference voltage is ground.

8. The multiplexer of claim 1, wherein the first power gate pass transistor is a PMOS transistor and the second power gate pass transistor is an NMOS transistor.

9. A multiplexer for fine-grain power gating comprising:
a first supply voltage input to receive a first supply voltage and a second supply voltage input to receive a second supply voltage, where the first supply voltage is greater than or equal to the second supply voltage;
a plurality of inputs;

a plurality of selection inputs;
a selection circuitry configured to select one of the plurality of inputs based upon the plurality of selection inputs, wherein the selection circuitry includes a plurality of pass transistors including a first power gate pass transistor and a second power gate pass transistor, wherein each pass transistor includes an input which is associated with and coupled to at least one of the plurality of inputs and a gate which is associated with and coupled to at least one of the plurality of selection inputs, where one of the plurality of inputs is the first supply voltage which is coupled to the first power gate pass transistor and one of the selection inputs is a power gating enable input which is coupled to the first power gate pass transistor to enable the first power gate pass transistor;
control circuitry coupled to the selection circuitry and configured to drive the plurality of selection inputs, where the control circuitry comprises a memory configured to control the plurality of selection inputs to cause the selection circuitry to select a specific input from the plurality of inputs, wherein the first supply voltage input does not receive the first supply voltage until at least a portion of the memory is programmed;
an output inverter stage, coupled to outputs of the plurality of transistors of the selection circuitry, comprising a PMOS transistor and an NMOS transistor connected in series between the second supply voltage and a reference voltage, where at least one input to the output inverter stage is provided to the gates of the PMOS and NMOS transistors via one of the plurality of pass transistors of the selection circuitry and the connection between the PMOS and NMOS transistors forms an inverted output;
wherein the selection circuitry is configured so that selection of the power gating enable signal applies the first supply voltage to the gate of the PMOS transistor and places the PMOS transistor in a cutoff mode of operation;
wherein:
one of the plurality of inputs is the reference voltage which is coupled to the second power gate pass transistor;
the at least one input to the output inverter stage comprises a PMOS inverter input provided to the gate of the PMOS transistor, where the first supply voltage is provided to the gate of the PMOS transistor via the PMOS inverter input and the first power gate pass transistor in response to selection of the power gating enable input to place the PMOS transistor in a cutoff mode of operation;
the at least one input to the output inverter stage comprises a NMOS inverter input provided to the gate of the NMOS transistor, where a signal from the reference voltage is provided to the gate of the NMOS transistor via the NMOS inverter input and the second power gate pass transistor in response to selection of the power gating enable input to place the NMOS transistor in a cutoff mode of operation; and
a transmission gate connected between the gates of the PMOS and NMOS transistors of the output inverter stage and configured to isolate the gates of the PMOS and NMOS transistors in response to selection of the power gating enable input so that the PMOS inverter input and the NMOS inverter input separately drive the gates of the PMOS and NMOS transistors, respectively;
and wherein at least one of the plurality of select inputs being set to a first state disables selection of the power gating enable input.

10. A multiplexer for fine-grain power gating comprising:
a first supply voltage input to receive a first supply voltage and a second supply voltage input to receive a second supply voltage, where the first supply voltage is greater than or equal to the second supply voltage;
a plurality of inputs;
a plurality of selection inputs;
a selection circuitry configured to select one of the plurality of inputs based upon the plurality of selection inputs, wherein the selection circuitry includes a plurality of pass transistors including a first power gate pass transistor, wherein each pass transistor includes an input which is associated with and coupled to at least one of the plurality of inputs and a gate which is associated with and coupled to at least one of the plurality of selection inputs, where one of the plurality of inputs is the first supply voltage which is coupled to the first power gate pass transistor and one of the selection inputs is a power gating enable input which is coupled to the first power gate pass transistor to enable the first power gate pass transistor;
an output inverter stage, coupled to outputs of the plurality of transistors of the selection circuitry, comprising a PMOS transistor and an NMOS transistor connected in series between the second supply voltage and a reference voltage, where at least one input to the output inverter stage is provided to the gates of the PMOS and NMOS transistors via one of the plurality of pass transistors of the selection circuitry and the connection between the PMOS and NMOS transistors forms an inverted output; and
wherein the selection circuitry is configured so that selection of the power gating enable signal applies the first supply voltage to the gate of the PMOS transistor and places the PMOS transistor in a cutoff mode of operation;
wherein:
the plurality of pass transistors of the selection circuitry includes a second power gate pass transistor;
one of the plurality of inputs is the reference voltage which is coupled to the second power gate pass transistor;
the at least one input to the output inverter stage comprises a PMOS inverter input provided to the gate of the PMOS transistor, where the first supply voltage is provided to the gate of the PMOS transistor via the PMOS inverter input and the first power gate pass transistor in response to selection of the power gating enable input to place the PMOS transistor in a cutoff mode of operation;
the at least one input to the output inverter stage comprises a NMOS inverter input provided to the gate of the NMOS transistor, where a signal from the reference voltage is provided to the gate of the NMOS transistor via the NMOS inverter input and the second power gate pass transistor in response to selection of the power gating enable input to place the NMOS transistor in a cutoff mode of operation;
a transmission gate connected between the gates of the PMOS and NMOS transistors and configured to isolate the gates of the PMOS and NMOS transistors in response to selection of the power gating enable input so that the PMOS inverter input and the NMOS inverter input separately drive the gates of the PMOS and NMOS transistors, respectively;

wherein the transmission gate is a high threshold voltage transmission gate.

* * * * *